(12) United States Patent
Larsson et al.

(10) Patent No.: US 6,303,278 B1
(45) Date of Patent: Oct. 16, 2001

(54) METHOD OF APPLYING METAL LAYERS IN DISTINCT PATTERNS

(75) Inventors: Karl-Gunnar Larsson, Kalix; Alf Lage Pettersson; Stig Tomas Hedlund, both of Umea; Willis Rudolf Forsling, Gammelstad; Lars Anders Gunneriusson; Mats Einar Eugen Lindberg, both of Lulea, all of (SE)

(73) Assignee: Cuptronic AB, Kalix (SE)

( * ) Notice: Subject to any disclaimer, the term of this patent is extended or adjusted under 35 U.S.C. 154(b) by 0 days.

(21) Appl. No.: 09/015,943

(22) Filed: Jan. 30, 1998

Related U.S. Application Data
(60) Provisional application No. 60/041,582, filed on Mar. 24, 1997.

(30) Foreign Application Priority Data

Jan. 31, 1997 (SE) .................................................... 9700307

(51) Int. Cl.$^7$ ..................................................... G03C 5/00
(52) U.S. Cl. ........................... 430/324; 430/315; 430/326
(58) Field of Search .................................. 430/311, 322, 430/324, 326, 315; 427/96; 216/13

(56) References Cited

U.S. PATENT DOCUMENTS 5,225,495 * 7/1993 Han et al. ............................ 525/327
5,919,402 * 7/1999 Murhphy et al. .................... 252/514

FOREIGN PATENT DOCUMENTS

| | | |
|---|---|---|
| 0187706A2 | 7/1986 | (EP) . |
| 0309684A1 | 4/1989 | (EP) . |
| 0487857A2 | 6/1992 | (EP) . |
| 2346743 | 10/1977 | (FR) . |

OTHER PUBLICATIONS

IBM Technical Disclosure Bulletin, vol. 30, No. 6, Anonym, "Method of improving metal adhesion to polymide", p. 414, Nov. 1987.
WPI/Derwent's abstract, No. 85–253684, week 8522, Abstract of JP, 60169186, Sep. 2, 1985.
WPI/Derwent's abstract, No. 80–57740C, week 8025, Abstract of JP, 55086744, Jun. 30, 1980.

* cited by examiner

Primary Examiner—Christopher G. Young
(74) Attorney, Agent, or Firm—Birch, Stewart, Kolasch & Birch, LLP

(57) ABSTRACT

In using a photoinitiator and irradiation with UV-light suitable monomers can be selectively inoculated on the surface of a non conducting substrate in a distinct pattern. Metal ions are thereafter absorbed by these monomers and are reduced. To this pattern further conducting materials, e.g. metals, can thereafter be added in a conventional way. The method according to the invention comprises a fully additive method to produce a circuit board with high resolution and the production of functional components directly on a non conducting substrate. (FIG. 2)

25 Claims, 4 Drawing Sheets

METHOD OF APPLYING METAL LAYERS IN DISTINCT PATTERNS

Figure 1:
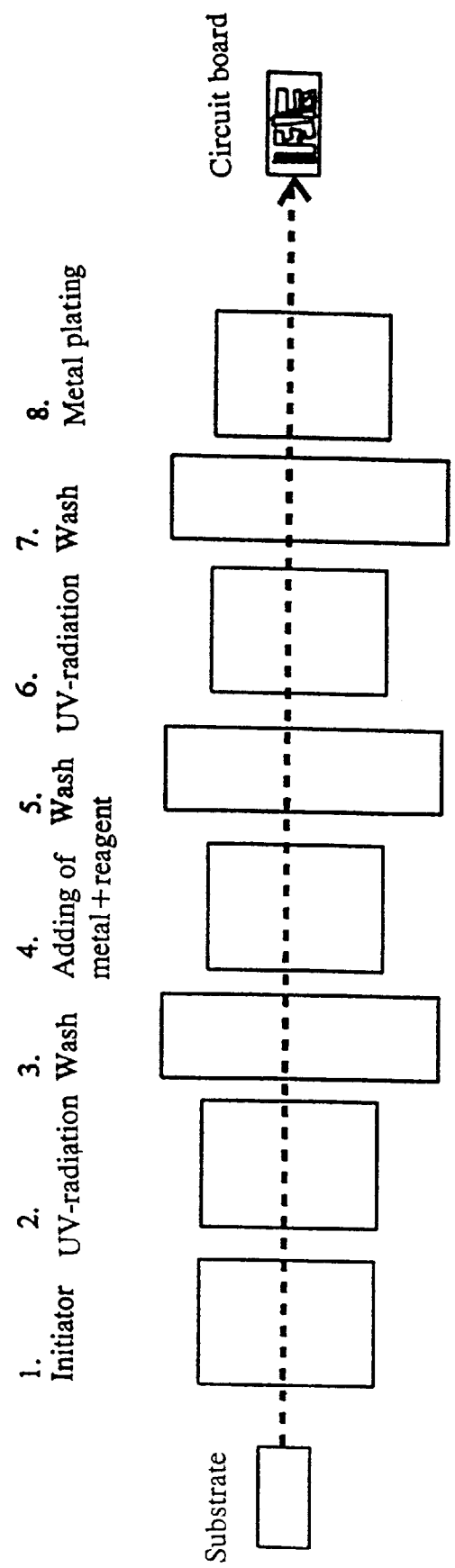

This application claims priority on provision application Ser. No. 60/041,582 filed on Mar. 24, 1997, the entire contents of which are hereby incorporated by reference.

The present invention relates to a new method for modifying surfaces in an organic material, especially a polymeric material. The method is especially related to modifying non conducting surfaces to facilitate the arrangement of conducting material in distinct patterns on said surfaces. The present invention also comprises methods to produce products with conducting materials in distinct patterns as well as products produced by means of one of these methods.

BACKGROUND OF THE INVENTION

In many different technical fields there is a need to arrange thin layers of a conducting material on a non conducting substrate. In the manufacturing of electronic components this need is evident. Circuit boards are an example of products, where materials with different conducting properties are required to be combined with a large precision and a high resolution. Nowadays ever increasing demands are put on both the production processes and the products. The methods mainly used nowadays to produce circuit boards are subtractive. This implies that one starts from a substrate provided with a conductor, from which substrate the conducting material is removed in several successive steps from the surfaces where an electric conducting capacity is not desirable.

In traditional manufacturing of circuit boards one starts from a substrate or a basic laminate, in which a hole picture is drilled to allow the application components and/or connection of conducting layers on opposite sides of the substrate. On the substrate is thereafter deposited a conducting material in the holes, usually copper. Then, a thin light sensitive film is applied over the substrate, often under high pressure and high temperature. On this film a photographing tool is placed in form of a negative picture of the desired circuit pattern, the photographing tool then being exposed to UV-light, the film thereby polymerizing in the exposed areas. The exposed, light sensitive film is developed and the non polymerized areas are washed off by means of a suitable base. The desired circuit pattern is thus enclosed by the remaining film. Then, a metal e.g. copper is electrolytically plated, according to this pattern. Over this pattern tin or lead is plated, whereafter the film is removed in a bath, e.g. by means of a strong base. Thereafter, the layer of tin or lead is etched off, whereafter a liquid soldering masque is applied, e.g. in form of an epoxy color with two components. The soldering masque is exposed and developed and finally a protective layer in nickel or gold is applied to prevent any oxidation.

This method involves several drawbacks. Firstly the production process is very labor intensive leading to that the production of circuit boards is to a large extent being transferred to countries with low labor costs. Secondly large quantities of residues harmful to the environment are formed, mainly in the form of etching fluids with high metal contents, e.g. copper, lead, tin, etc. Thirdly the existing production methods do not comply with the increasing technical demands. The conventional methods are approaching their inherent limits, especially regarding the line width.

Thus, there is an apparent demand to simplify the production processes, to increase the automatisation level and to simultaneously remove the environmental problems connected with the present use of reactive chemicals and metals in solution. Simultaneously a lot of research and development efforts are aiming at making both electronic components and circuit boards less material and space consuming. The production of circuit boards is here below presented as an example for one of the many applications, for which the present invention is applicable.

STATE OF THE ART

It is already known to modify polymeric surfaces to increase the adhesive capacity between them. For example Wan-Tai Yang e.g. describes in his doctor's dissertation 'Lamination by photografting'(KTH, Institute for Polymer Technology) how thin polymeric layers can be joined together by using photoinitiators and a irradiation with UV-light. The advantage with photolamination is that the method consumes little energy, does not create any waste to be discharged, involves short hardening periods and provides excellent product features, such as lack of shrinkage and the avoidance of enclosed solvents.

U.S. Pat. No. 4,006,269 describes a method to make the surface of a substrate in a non conducting material more sensitive using a substance which photochemically removes a hydrogen atom from a proton donator in the presence of a suitable solvent and provides a ketyl radial, whereafter the substrate is submerged in a platina solution comprising metal ions. Thereafter, the substrate is irradiated being submerged in the platina solution with an UV-irradiation within the interval between 200 and 400 $\mu$m to provide said ketyl radical reducing metal ions to metal. As suitable sensitizing compounds are named benzophenone, mono- or di-para-substituted halogen, methyl-, methoxi- and sulphonate-benzophenone. As a proton donator a secondary alcohol is used, e.g. benzoehydrole. As an example of solvents is named isopropylalcohol, ethylene glycol and polyethylene glycol. As an example of plating metals are named nickel and copper.

SHORT DESCRIPTION OF THE INVENTION

The present invention relates to a new method for modifying surfaces according to the attached claims. The invention especially concerns a new method to arrange conducting materials in distinct patterns on a substrate of a polymeric material or a substrate containing at least one surface with a surface layer of an organic material according to the attached claims.

The present invention also comprises products manufactured by means of the new method.

SHORT DESCRIPTION OF THE DRAWINGS

Figure 2:
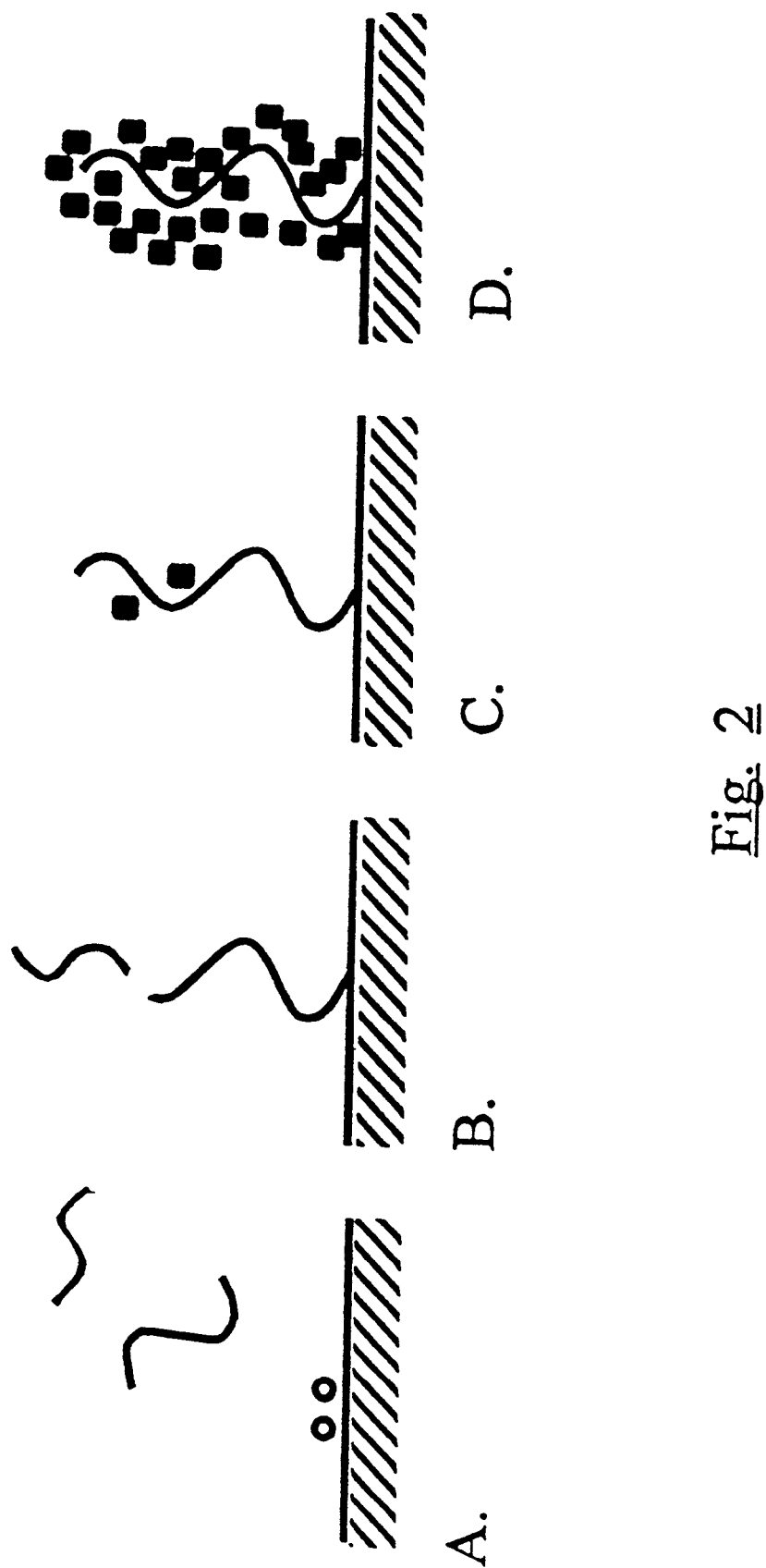
Figure 3:
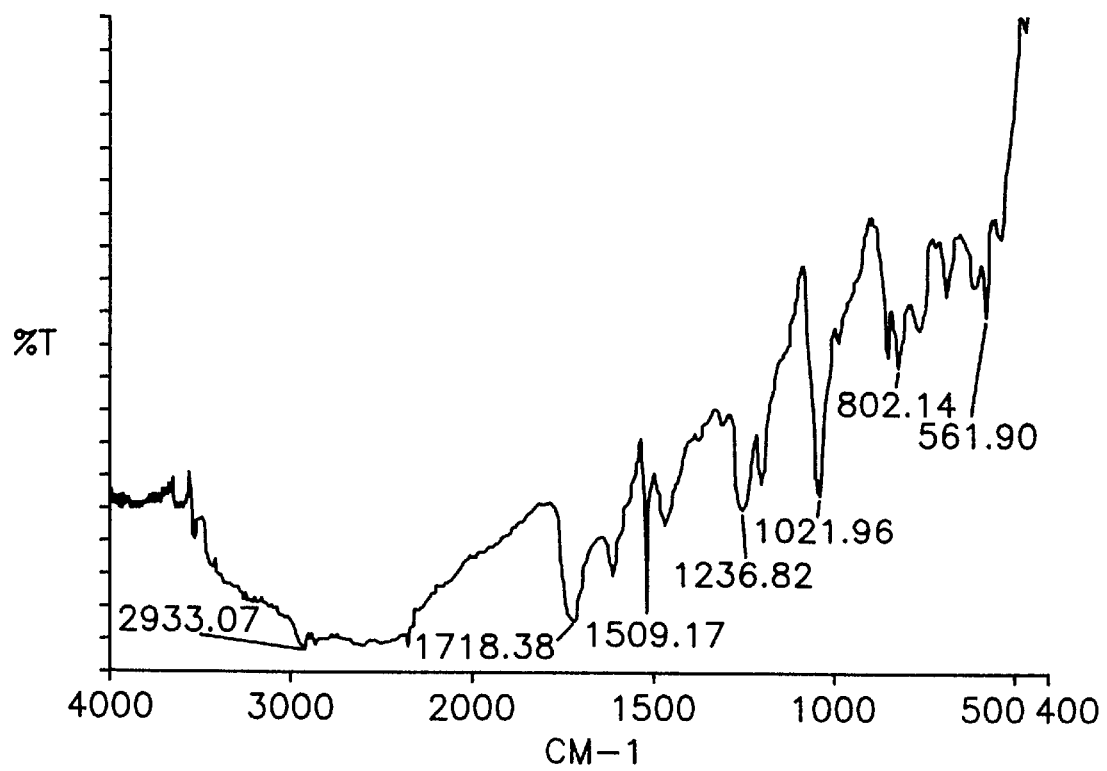
Figure 4:
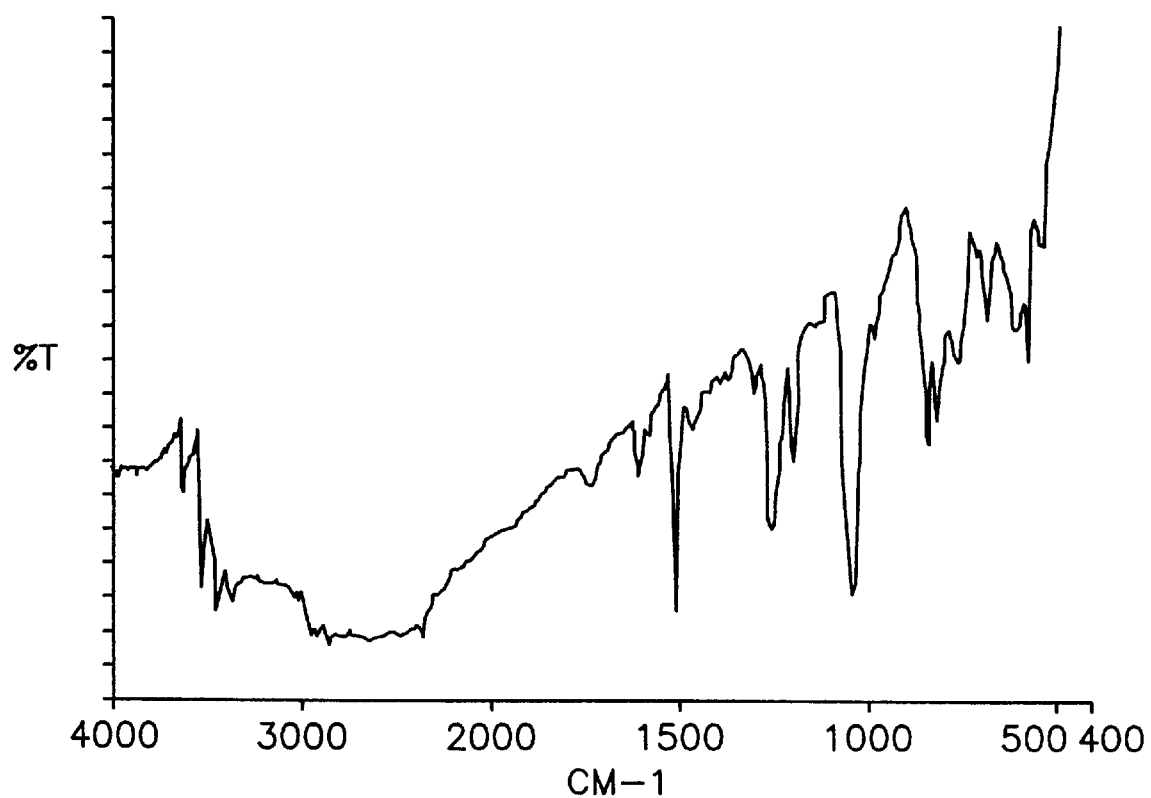

FIG. 1 shows schematically the various process steps according to one embodiment of the invention in the form of a flow chart, FIG. 2 shows schematically the various process steps for surface modification and for arranging a conductor according to a preferred embodiment of the invention, FIG. 3 is a FTIR-spectrogramme showing the IR-absorption for an epoxy laminate surface modified according to the invention (observe the absorption at 1718 $cm^{-1}$) and FIG. 4 is a FTIR-spectrogramme showing the IR-absorption for an untreated surface.

DESCRIPTION OF THE INVENTION AND ITS PREFERRED EMBODIMENTS

The present invention is related to a new method to modify surfaces of an organic material, preferably a polymeric material, the method comprising a chemical modification of said surface or more exactly the outside of said surface to achieve distinct areas for an adhesion according to a desired pattern. The invention especially relates to a method, where the surface of a substrate is modified by means of grafting of suitable functional groups according to a desired pattern, whereafter a conducting material is arranged at these groups. Preferably, charged molecules of a functional substance, preferably ions of a conducting substance, most preferably metal ions, are provided by means of adsorption on the modified surface, whereafter said ions are thermally or photochemically reduced into an atomic state. This conducting material provides then the base for the forming of a conducting layer with the desired thickness according to the specific, desired pattern This application of a thicker layer can be performed by using conventional autocatalytic baths for metal plating or by means of other suitable methods such as atomization in an inert atmosphere.

Preferably, said modification is performed in that the surface layer first is treated with a chemical compound with the capacity to remove hydrogen atoms from the surface layer during the initiation with focused radiation energy, e.g. using ultraviolet radiation. According to a preferred embodiment of the invention said chemical compound has moreover the capacity to achieve a covalent bond between the surface layer and the groups comprised in the compound. These groups are suitably polymerisable hydrocarbon chains. According to an embodiment of the invention these groups are selected from aromatic ketones and aromatic alifatic ketones or other suitable compounds with a strong UV-absorption in the practically usable interval between 200 and 400 nm. Even other groups might of course be used, being initiable with radiation in a selectable, practically usable interval. Alternatively, a mixture of a photo-initiator and a suitable monomer or suitable monomer is used.

The expression "substrate" denotes in the below each suitable non conducting substrate. Examples of suitable substrates according to the invention are plane disks in a polymeric material or with at least one surface of a polymeric material. All materials comprising abstractable hydrogen atoms are suitable for a use according to the present invention. Especially suitable polymeric materials are e.g. epoxy resins and polyimids.

In connection with the present invention it is however important that the surface in question comprises secondary and/or tertiary hydrocarbon compounds. Preferably the surface comprises tertiary hydrocarbon compounds. Usually, the substrates have the form of plane disks, e.g. glass fiber reinforced disks in a epoxy resin or in a corresponding suitable polymeric material. Other suitable substrate materials are glass and ceramics pretreated in a suitable manner, e.g. silanized. For a person skilled in the art it is obvious that the substrate even might comprise several disks arranged on top of each other. Likewise, new substrate layers might be arranged on top of a layer comprising a modified surface and thereon arranged one or several materials. A surface with a distinct pattern of a conducting material might e.g. be arranged according to the invention, be coated with a polymeric layer, whereafter further conducting materials are arranged in a distinct pattern onto this layer. This surface can in its turn be coated with a polymeric layer and the procedure might be repeated. For the skilled person it is obvious that suitable connections might be arranged between the layers.

The term "initiator" denotes in the below each suitable chemical compound capable of initiating, when exposed to a radiation source, a chemical reaction on the substrate surface. Preferably the initiator is a compound with the ability to form radicals. Preferably the initiator is a photoinitiator, most preferably a compound with the feature of not being subject to photosplicing, but preferably instead a photoreduction by means of abstracting a hydrogen.

Examples of suitable photoinitiators are compounds comprising carbonyl groups, preferably aromatic ones. Aromatic ketones and aromatic alifatic ketones absorb UV-radiation, especially in the interval between 200 and 300 nm, making these compounds usable as initiators according to the invention. Even alifatic ketones and aldehydes might be used. The photoinitiator according to the present invention can be selected from the group comprising aromatic ketones, such as benzophenone, 4-chloro benzophenone, 4,4' dichloro benzophenone, 4-benzyl benzophenone, benzoyl naphthalene, xanthone, anthraquinone, 9-fluorenone, benzopinacole, optional amino aromatic ketones, and mixtures thereof The photoinitiator according to the present invention can also be selected from the group comprising aromatic alifatic ketones, such as acetophenone, benzoyl dimethylketal (BDK), hydroxy-cyclo-hexyl-acetophenone and mixtures thereof The photoinitiator according to the present invention can also be selected from the group comprising di-ketones, such as bi-acetyl, 3,4-hexane-di-one, 2,3-pentane-di-one, 1-phenyl-1,2-propane-di-one, benzene, benzoylformic acid and mixtures thereof The photoinitiator according to the present invention might also be selected from the group comprising alifatic carbonyl compounds, such as formaldehyde, acetic aldehyde, acetone, 2-pentanone, 3-pentanone, cyclohexanone and mixtures thereof Besides the optional mixtures as above of the above mentioned compounds in suitable proportions, also methanol sulphonate esters of benzophenone are usable according to the invention.

Moreover, it is according to the present invention desirable, that the initiator in question mainly only removes tertiary or tertiary and secondary hydrogen atoms from the substrate surface when exposed. This exposure might be provided by using a focused radiation source, a pattern being drawn directly on the substrate, or by using a mask, the pattern being drawn on the mask and the mask applied between the substrate and the radiation source with a subsequent exposure.

In connection with the present invention the expression "radiation source" comprises any suitable radiation source with the ability to initiate a chemical reaction on the substrate surface. In case the pattern is directly drawn on the substrate surface it is necessary to use a focused radiation source with the radiation focused in such a way, that the desired resolution can be achieved. Preferably, a focusable radiation source is used, controllable in the xy-plane, e.g. a UV-laser plotter.

The expression "conducting material" is here used as a common designation for materials able to transmit signals, e.g. electric pulses or light pulses. Thus, substrates designated "non conducting" are not transmitting or interfere with signals propagating in the conducting material or materials applied to the substrate. Suitable conducting materials are metals, e.g. within the electronic industry conventionally used metals such as gold, silver, copper, nickel and palladium.

For the skilled person it is obvious, that the expression "distinct pattern" relates to a physical restriction of a material with an in this connection desired feature, e.g. electric conductivity, compared to another material lacking this feature or comprising it to a much smaller extent. In the example circuit boards, being used in the present description to illustrate the invention, pattern concerns the conductor design in two or three dimensions of and possibly the components inserted in the circuit board.

Suitable monomers are monomers able to bond covalently to the substrate surface layer. Examples of such are organic molecules having a double bond between two carbon atoms. According to a preferred embodiment these monomers have conducting groups or can easily be modified to incorporate conducting groups. The monomers according to the present invention can be selected amongst: acrylic acid, methacrylic acid, butyl acrylate, glycidyle acrylate, glycidyl methacrylate, methyl-meth-acrylate, vinylpyrdine isomers, acrylonitrile, vinyl acetate, N-vinyl-2-pyrrolidone, 4-vinylpyrridine, 1,4-butanedioldimeth-acrylate, styrene and mixtures thereof.

The mixture of an initiator and alkene can in various ways be applied to the substrate surface. A solution comprising the initiator and the alkene can be spread or sprayed or vaporized and made to condense onto the substrate surface. Practically this might be achieved in solving the initiator and the monomer, e.g. a suitable alkene, in a suitable solvent, e.g. acetone. In certain cases the alkene itself can be the solvent, e.g. using such alkenes which are fluid at the temperature of use. According to a preferred embodiment of the invention the initiator is applied as a mist or an aerosol onto the substrate surface. The aerosol consists suitably of finely dispersed fluid drops of the initiator, eventually solved in a suitable solvent, dispersed in a particle free gas. To facilitate the application of an even layer of the initiator onto the substrate the substrate is suitably grounded and the aerosol fluid drops given a slight electric charge. The modified surface is treated with a solution of a suitable metal ion such as Pd(II), Pt(II), Cu(II), Ni(II) or Ag(I). By selecting suitable functional groups on the alkene previously applied to the surface, these metal ions can be made to be strongly absorbed on the surface. Then the metal ions are reduced to an atomic state. The reduction can be performed by means of a chemical reaction in solution or by means of a photochemical reaction. The reduction step might even comprise a thermal treatment. When using reduction agents these might be applied externally or the polymers being inoculated on the surface can, with the right selection of monomers, act as a reduction agents.

In this way a thin, uniformly conducting layer, preferably a metal layer, is applied selectively to the modified portions of the substrate surface. However, this layer is too thin to be practically usable for any presently known electronic applications and must therefore become thicker. This is suitably achieved by means of a treatment with a solution containing metal ions, complexing agents and reduction agents. For this purpose several commercial reagent systems are commercially available. Alternatively, the metal to be applied to the first thin layer can be atomized in a vacuum chamber or in an inert gas atmosphere and a low polarity simultaneously be provided on the first thin layer.

FIG. 2 shows schematically, how the substrate surface is modified and how the modified surface is brought into contact with suitable monomers (A), the monomers adhering to the surface and a polymer are built up by suitable monomers with possible functional groups (B), conducting materials is provided to the polymers (C) and the conducting layer is reinforced by the provision of further conducting materials (D).

According to an embodiment of the invention the method comprises the following steps: providing an initiator to the substrate surface, V-irradiation, a wash, addition of metal 10 plus reagent to the surface, UV-irradiation, another wash and a metal plating (FIG. 1).

According to a further embodiment of the invention the method can comprise a direct arranging of a conducting material to the surface, i.e. monomers with conducting groups, followed e.g. by an atomization of metal and electroplating.

According to a preferred embodiment of the invention the method consists of a fully additive method for producing circuit boards, with the card or substrate surface being selectively coated with a metal and the conducting pattern being achieved directly without any steps to remove a metal surplus by means of etching. Preferably, the substrate consists of a fiber reinforced polymeric mixture, the photoinitiator is a bensoephenone and acrylic monomers are provided in admixture with the photoinitiator.

When using the method according to the invention functional, e.g. conducting, structures can be provided to non conducting substrates with a very high resolution The new method according to the invention lacks the inherent limitations of the known methods and enables theoretically line widths down to a size in the order of 1 to 10 angstrom (0,1–1 nm). In practice the resolution is limited by the resolution of the focused light source and its control as well as the size of the used polymers and metal atoms. A practically usable line width, which is possibly achievable using the method according to the invention, but impossible to achieve by means of conventional methods, lies in the interval between 1 and 5 $\mu$m. The method according to the invention facilitates thus the production of active components directly on the non conducting substrate. It is e.g. possible to produce, using the method according to the invention, capacitors, resistors and even processors directly on a substrate, e.g. as integrated parts of a circuit board. The method according to the invention provides also the possibility to produce sensors, e.g. mechanical or biological sensors directly on a circuit board. In selecting the features of the functional material applied on the substrate surface according to the invention it is possible to produce products with the capacity to indicate changes in mechanical, electromagnetic, chemical or biochemical states and reactions. Examples of sensors suitable for the production according to the invention are dynamic sensors, e.g. acceleration or braking sensors, chemical sensors, e.g. gas detectors, biomedical sensors, e.g. sensors for blood analysis. The possibility to achieve distinct patterns of selectable molecules on a substrate opens even the possibility to design synthetic nerve paths or contact surfaces between a human and a synthetic tissue, e.g. interfaces for the control of artificial limbs.

Moreover, the present invention is illustrated by means of the following enabling examples not to be interpreted to limit the scope of the invention specified in the attached claims.

EXAMPLES

Comparative Example 1 epoxy laminate surfaces were treated with acrylic acid monomers in the presence of benzoephenone. Acetone was used as a solvent. The reagent mixture was spread onto the substrate surface. To achieve a sufficiently thin reagent layer a disc of quartz glass was pressed over the sample during the irradiation with UV-light. The result was a visually distinct change of the surface. Measurements with FTTRspectroscopy (Fourier-transformed infrared spectroscopy) indicated that surfaces treated according to the invention were covered with carbonyl groups. This becomes especially evident by the absorption taking place at 1718 cm$^{-1}$ (see FIG. 3) which in a surface inoculated sample is stronger than the other absorptions compared with an untreated surface (see FIG. 4).

Comparative Example 2 epoxy laminate surfaces were treated with acrylic acid monomers in the presence of benzophenone above. Thereafter, a palladium chloride solution was applied on the surface, whereafter the surface was irradiated with UV-light. Micrographs taken with SEM (sweep electronic microscope) indicate that a crystalline structure, i.e. a metal film, had been formed. A corresponding structure could not be observed on untreated surfaces.

Production Example 1 a substrate in form of a glass fiber reinforced epoxy disk was covered with a thin layer (less than about 10 µm) benzoephenone dissolved in acrylic acid (5 g/10 g). A lithographic film was applied on the surface, whereafter it was irradiated with UV-light within the wave length range of 200 to 400 nm. After exposure the lithographic film was removed. Homopolymers were removed by means of an extraction in hot, clean water (with a temperature of about 50 to 70° C.) during three hours. Thereafter, the substrate was treated in a solution of palladium chloride (1 g PdCl$_2$, 1 g HCl) during 1 to 10 minutes. Thereafter, the substrate was rinsed quickly with water and was plunged during 5 seconds in a solution of disodium anthraquinone-disulphonic acid and glycol. After drying the surface was irradiated during 30 seconds with UV-light (200 to 400) nm). After a washing in clean water during 30 seconds the substrate was subjected to an autocatalytic metal plating to build up the active surfaces to a desired thickness.

Production Example 2 the substrate was treated in the same way as in the production example 1, with the exception that no lithographic film was arranged. Instead the substrate was radiated with a focused UV-light source controllable in the xy-plane, a so-called UV-laser plotter, whereby the desired, distinct pattern was drawn upon the surface.

Although if the invention has been described with reference to preferred embodiments and examples which at the present are known to the inventor it is understood that various changes and modifications which are obvious to skilled person can be performed without departing from the scope of the invention as specified in the claims.

What is claimed is:

1. A method of applying metal layers in distinct patterns on an organic substrate comprising a secondary and/or tertiary hydrocarbon compound or on a substrate comprising at least one surface with a surface layer of an organic material comprising a secondary and/or tertiary hydrocarbon compound, said method comprising:

chemically modifying said surface layer by removing hydrogen atoms therefrom to achieve distinct adhesion areas of reactive radicals corresponding to said distinct patterns; and thereafter applying a solution of a metal ion to the modified surface to provide a metal layer in said distinct areas.

2. A method according to claim 1, characterized in that hydrogen atoms are removed from distinct areas on the surface layer through adding an initiator with the capacity to be activated by a UV-radiation, whereafter the distinct patterns are drawn upon the organic material surface using a source of radiation.

3. A method according to claim 2, characterized in that the desired patterns are drawn by using a focused UV-source.

4. A method according to claim 2, characterized in that the desired patterns are drawn upon a film arranged on the substrate surface, whereafter the substrate is exposed to a radiation source.

5. A method or radiation according to claim 4, characterized in that the chemical modification comprises that polymer chains are covalently bound to the substrate surface layer.

6. A method according to claim 5, characterized in that the removal of the hydrogen atoms and the covalent binding of the polymer chains are performed in one step.

7. A method according to claim 5, characterized in that the removal of the hydrogen atoms and the covalent binding of the polymer chains are performed in two subsequent steps.

8. A method according to claim 5, characterized in that said polymer chains comprise conducting groups or groups with the capacity to be substituted by conducting groups.

9. A method according to claim 8, characterized in that the conducting group is a chemical group including an element selected from the following group: palladium, nickel, copper, gold and silver.

10. A method according to claim 2, characterized in that the initiator is a compound selected from the group consisting of aromatic ketones, aliphatic ketones, aldehydes, and mixtures thereof.

11. A method according to claim 2, characterized in that the initiator is a compound selected from the group consisting of benzophenone, 4-chloro-benzophenone, 4,4' di-chloro benzophenone, 4-benzyl benzophenone, benzoylnaphtalene, xanthone, anthraquinone, 9-fluorenone, benzopinacole, aromatic ketones, acetophenone, benzo dimethylketal, hydroxy-cyclo-hexyl-aceto-phenone, biacetyl, 3,4-hexane-di-one, 2,3-pentane-di-one, 1-phenyl-1,2-propane-di-one, benzol, benzoyl-formic acid, formaldehyde, acetic aldehyde, acetone, 2-pentanone, 3-pentanone, cyclohexanone, methanolic sulphonate esters of benzophenone and mixtures thereof.

12. A method according to claim 2, characterized in that the desired pattern is drawn upon a film arranged on the substrate surface, whereafter the substrate is exposed to a UV-source.

13. A method of forming a metal layer on a substrate comprising a secondary and/or tertiary hydrocarbon compound, said method comprising:
irradiating at least one surface of the substrate;
modifying the surface of the substrate with at least one chemical compound capable of removing hydrogen atoms from the surface during the irradiating step;
adsorbing metal ions from a solution onto the surface after the modifying step; and
reducing the metal ions to their atomic state to form the metal layer.

14. The method of claim 13, further comprising:
thickening the metal layer by use of an autocatalytic bath or atomization in an inert atmosphere.

15. The method of claim 13, wherein the reducing step includes a thermal or photochemical process.

16. A method of applying metal layers in distinct patterns on an organic substrate or on a substrate comprising at least one surface with a surface layer of an organic material, said method comprising:

chemically modifying said surface layer by removing hydrogen atoms therefrom to achieve distinct adhesion areas of reactive radicals corresponding to said distinct patterns and covalently bonding polymer chains comprising conducting groups or groups with the capacity to be substituted by conducting groups to the substrate surface layer; and thereafter applying a metal layer to said distinct areas.

17. A method according to claim 16, characterized in that hydrogen atoms are removed from distinct areas on the surface layer through adding an initiator with the capacity to be activated by a UV-radiation, whereafter the distinct patterns are drawn upon the organic material surface using a source of radiation.

18. A method according to claim 17, characterized in that the desired patterns are drawn by using a focused UV-source.

19. A method according to claim 17, characterized in that the desired patterns are drawn upon a film arranged on the substrate surface, whereafter the substrate is exposed to a radiation source.

20. A method according to claim 16, characterized in that the removal of the hydrogen atoms and the covalent binding of the polymer chains are performed in one step.

21. A method according to claim 16, characterized in that the removal of the hydrogen atoms and the covalent binding of the polymer chains are performed in two subsequent steps.

22. A method according to claim 16, characterized in that the conducting group is a chemical group including an element selected from the following group: palladium, nickel, copper, gold and silver.

23. A method according to claim 17, characterized in that the initiator is a compound selected from the group consisting of aromatic ketones, aliphatic ketones, aldehydes, and mixtures thereof.

24. A method according to claim 17, characterized in that the initiator is a compound selected from the group consisting of benzophenone, 4-chlorobenzophenone, 4,4'-dichlorobenzophenone, 4-benzylbenzophenone, benzoylnaphtalene, xanthone, anthraquinone, 9-fluorenone, benzopinacole, aromatic ketones, acetophenone, benzodimethylketal, hydroxy-cyclohexyl-aceto-phenone, biacetyl, 3,4-hexane-dione, 2,3-pentane-dione, 1-phenyl-1, 2-propane-dione, benzol, benzoyl-formic acid, formaldehyde, acetic aldehyde, acetone, 2-pentanone, 3-pentanone, cyclohexanone, methanolic sulphonate esters of benzophenone and mixtures thereof.

25. A method according to claim 17, characterized in that the desired pattern is drawn upon a film arranged on the substrate surface, whereafter the substrate is exposed to a UV-source.

* * * * *